United States Patent
Bhatnagar et al.

(10) Patent No.: US 10,648,293 B2
(45) Date of Patent: May 12, 2020

(54) QUANTIFICATION OF CROSSFLOW EFFECTS ON FLUID DISTRIBUTION DURING MATRIX INJECTION TREATMENTS

(71) Applicant: HALLIBURTON ENERGY SERVICES INC., Houston, TX (US)

(72) Inventors: Ankit Bhatnagar, Maharashtra (IN); Chaitanya Mallikarjun Karale, Maharashtra (IN); Rama Subba Reddy Thavva, Maharashtra (IN)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 152 days.

(21) Appl. No.: 15/741,427

(22) PCT Filed: Aug. 5, 2015

(86) PCT No.: PCT/US2015/043863
§ 371 (c)(1),
(2) Date: Jan. 2, 2018

(87) PCT Pub. No.: WO2017/023318
PCT Pub. Date: Feb. 9, 2017

(65) Prior Publication Data
US 2018/0371873 A1 Dec. 27, 2018

(51) Int. Cl.
*E21B 43/20* (2006.01)
*E21B 47/06* (2012.01)
(Continued)

(52) U.S. Cl.
CPC .......... *E21B 41/0092* (2013.01); *E21B 37/06* (2013.01); *E21B 43/20* (2013.01);
(Continued)

(58) Field of Classification Search
CPC ......... E21B 49/008; E21B 47/06; E21B 43/20
See application file for complete search history.

(56) References Cited

U.S. PATENT DOCUMENTS 6,283,210 B1   9/2001   Soliman et al.
7,055,604 B2   6/2006   Jee et al.
(Continued)

FOREIGN PATENT DOCUMENTS

| CA | 2798850 A1 | 11/2011 |
|---|---|---|
| WO | WO 2011/048374 A1 | 4/2011 |
| WO | WO 2013/016734 A1 | 1/2013 |
| WO | WO 2015/112210 A1 | 7/2015 |

OTHER PUBLICATIONS

International Search Report and The Written Opinion of the International Search Authority, or the Declaration, dated May 19, 2016, PCT/US2015/043863, 10 pages, ISA/KR.
(Continued)

*Primary Examiner* — Catherine Loikith

(57) ABSTRACT

Methods and systems for detection of crossflow and quantification of crossflow effects on fluid distribution during multistage injection treatments of hydrocarbon bearing reservoir formations. A low rate injection stage is applied after a main (high rate) fluid injection stage of a multistage injection treatment process. Wellbore temperature measurements can be utilized along with an inversion process to detect any crossflow and quantify its effects on fluid distribution during the main injection stage. After the effects of any detected crossflow on the fluid distribution are quantified, the effectiveness of the multistage injection treatment can be analyzed and any adjustments or modifications to the treatment can be made accordingly.

19 Claims, 10 Drawing Sheets

(51) Int. Cl.
  *E21B 41/00* (2006.01)
  *E21B 43/25* (2006.01)
  *E21B 37/06* (2006.01)
  *E21B 43/26* (2006.01)
  *G06F 17/50* (2006.01)

(52) U.S. Cl.
  CPC .............. *E21B 43/25* (2013.01); *E21B 43/26* (2013.01); *E21B 47/065* (2013.01); *G06F 17/5009* (2013.01)

(56) References Cited

U.S. PATENT DOCUMENTS

| | | |
|---|---|---|
| 7,398,680 B2 | 7/2008 | Glasbergen et al. |
| 2007/0234789 A1 | 10/2007 | Glasbergen et al. |
| 2008/0257544 A1 | 10/2008 | Thigpen et al. |
| 2010/0082258 A1 | 4/2010 | Wang |
| 2011/0030963 A1 | 2/2011 | Demong et al. |
| 2013/0168090 A1 | 7/2013 | Themig et al. |
| 2013/0327522 A1 | 12/2013 | Glasbergen et al. |

OTHER PUBLICATIONS

Tabatabaei et al., "Theoretical Basis for Interpretation of Temperature Data During Acidizing Treatment of Horizontal Wells," Society of Petroleum Engineers, Apr. 1, 2013, vol. 28, Issue 2, SPE-163138-PA.

Tan et al., "Field Application of Inversion Method to Determine Acid Placement with Temperature Profiles," Society of Petroleum Engineers Technical Conference and Exhibition, Oct. 8-10, 2012, San Antonio, Texas, USA, SPE-159296-MS.

Tan et al., "Measurement of Acid Placement with Temperature Profiles," Society of Petroleum Engineers European Formation Damage Conference, Jun. 7-10, 2011, Noordwijk, The Netherlands, SPE-144194-MS.

Tardy et al., "Inversion of Distributed-Temperature-Sensing Logs to Measure Zonal Coverage During and After Wellbore Treatments With Coiled Tubing," Society of Petroleum Engineers, Feb. 1, 2012, vol. 27, Issue 1, SPE-143331-PA.

Yoshioka et al., "A New Inversion Method to Interpret Flow Profiles From Distributed Temperature and Pressure Measurements in Horizontal Wells," Society of Petroleum Engineers, Nov. 1, 2009, vol. 24, Issue 4, SPE-109749-PA.

QUANTIFICATION OF CROSSFLOW EFFECTS ON FLUID DISTRIBUTION DURING MATRIX INJECTION TREATMENTS

PRIORITY

The present application is a U.S. National Stage patent application of International Patent Application No. PCT/US2015/043863, filed on Aug. 5, 2015, the benefit of which is claimed and the disclosure of which is incorporated herein by reference in its entirety.

TECHNICAL FIELD

The present disclosure generally relates to monitoring of fluid distribution in a hydrocarbon bearing reservoir formation during stimulation treatments and, more particularly, to detection and quantification of crossflow effects on fluid distribution during fluid injection treatments.

BACKGROUND

Oil and gas wells produce oil, gas and/or petroleum byproducts from subterranean hydrocarbon reservoirs. Various methods and systems are utilized to drill wells into such a reservoir and then extract hydrocarbons from the drilled wells. To enhance hydrocarbon production from the reservoir, stimulation treatments are typically applied to improve near wellbore permeability/conductivity in the subterranean reservoir formation. One example of a commonly used stimulation treatment is the acid treatment, in which an acid based fluid mixture is injected into the subterranean reservoir formation to stimulate and increase the production of hydrocarbons from the reservoir. This is commonly referred to as acidizing. One such aqueous acid treatment, referred to as "matrix-acidizing", involves the introduction of an acid into a subterranean reservoir formation under a pressure below the formation fracture pressure so that the acid flows through the pore spaces of the reservoir formation. The acid of the aqueous acid treatment reacts with acid soluble materials contained in the reservoir formation to increase the size of the pore spaces and increase the permeability of the reservoir formation.

Wellbores are often drilled through reservoir formations that include two or more production zones. Such wells are typically completed by placing a casing along the wellbore length and perforating the casing adjacent each such production zone to extract the formation fluids (such as hydrocarbons) into the wellbore. These production zones are sometimes separated from each other by installing a packer between the production zones. During fluid injection, the fluid penetrates these zones. The extent of fluid penetration in each zone depends on the permeability and the reservoir pressures.

Due to heterogeneities in permeability and pressures in the formations surrounding the wellbore, sometimes the fluids flow from one zone into the wellbore and out into another zone. This phenomenon is called wellbore crossflow and is observed in commingled reservoirs. The crossflow can, for example, lead to inadequate fluid placement during scale-squeeze treatments, as well as to partial stimulation of high pressure zones during matrix acidizing. Real-time wellbore temperature measurements are commonly used to monitor fluid distribution during an injection treatment. However, crossflow effects are generally unnoticeable using temperature measurements acquired at high injection rates, as wellbore temperatures are dominated by a high temperature of an injected fluid, and therefore, produced fluids related to crossflow are unable to affect the wellbore temperatures significantly.

BRIEF DESCRIPTION OF THE DRAWINGS

Various embodiments of the present disclosure will be understood more fully from the detailed description given below and from the accompanying drawings of various embodiments of the disclosure. In the drawings, like reference numbers may indicate identical or functionally similar elements.

DETAILED DESCRIPTION

Figure 1:
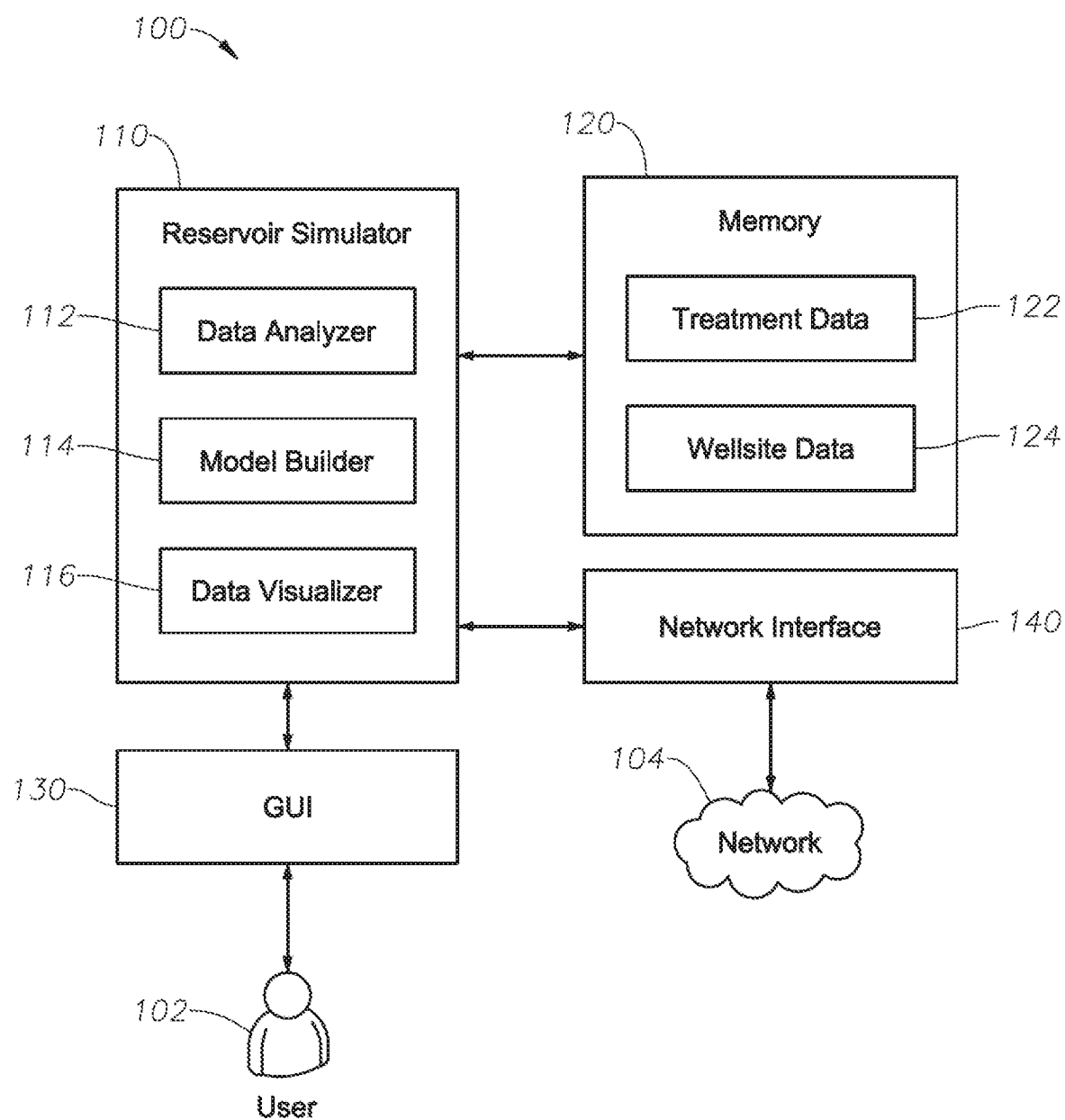
FIG. 1 is a block diagram of an illustrative computer system incorporating a near wellbore reservoir simulation model for aiding detection and quantification of crossflow during fluid injection treatments of hydrocarbon bearing reservoir formations.

Embodiments of the present disclosure relate to a framework for quantification of crossflow effects on fluid distribution during stimulation treatments of hydrocarbon bearing reservoir formations. While the present disclosure is described herein with reference to illustrative embodiments for particular applications, it should be understood that embodiments are not limited thereto. Other embodiments are possible, and modifications can be made to the embodiments within the spirit and scope of the teachings herein and additional fields in which the embodiments would be of significant utility.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described. It would also be apparent to one skilled in the relevant art that the embodiments, as described herein, can be implemented in many different embodiments of software, hardware, firmware, and/or the entities illustrated in the figures. Any actual software code with the specialized control of hardware to implement embodiments is not limiting of the detailed description. Thus, the operational behavior of embodiments will be described with the understanding that modifications and variations of the embodiments are possible, given the level of detail presented herein.

The foregoing disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper," "uphole," "downhole," "upstream," "downstream," and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. For example, if the apparatus in the figures is turned over, elements described as being "below" or "beneath" other elements or features would then be oriented "above" the other elements or features. Thus, the exemplary term "below" may encompass both an orientation of above and below. The apparatus may be otherwise oriented (rotated 90 degrees or at other orientations) and the spatially relative descriptors used herein may likewise be interpreted accordingly.

Illustrative embodiments and related methods of the present disclosure are described below in reference to FIGS. 1-8 as they might be employed, for example, in a computer system for performing quantification of crossflow effects on fluid distribution during stimulation treatments of hydrocarbon bearing reservoir formations. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

Embodiments of the present disclosure are directed to detecting and quantifying crossflow effects on fluid distribution in a hydrocarbon bearing reservoir formation during fluid injection treatments (e.g., matrix injection treatments). In one example, the disclosed embodiments may be used to adjust a fluid distribution profile of a multistage injection treatment in real time so as to account for any detected and quantified crossflow effects. As will be described in further detail below, a "low rate injection stage" may be introduced after a main stage (e.g., high rate injection stage) of the multistage injection treatment to detect the existence of crossflow, which would otherwise go unnoticed from temperature measurements obtained from the wellbore during the main stage. In one or more embodiments, the wellbore temperature measurements can be utilized along with an inversion model to quantify the effects of crossflow on fluid distribution during the main injection stage. The inversion model may be used, for example, to simulate heat transfer in the wellbore and reservoir during different stages of the fluid injection treatment in which crossflow may occur. The inversion model may be further used to match the measured and simulated wellbore temperature profiles to obtain the effect of crossflow on the fluid distribution. The disclosed techniques can therefore be used to determine the extent of crossflow during the actual matrix injection treatment.

FIG. 1 is a block diagram of an illustrative computer system 100 incorporating a near wellbore reservoir simulation model for aiding detection of the crossflow and quantification of crossflow effects on fluid distribution during fluid injection treatments of hydrocarbon bearing reservoir formations, according to certain embodiments of the present disclosure. As shown in FIG. 1, system 100 includes a near wellbore reservoir simulator 110, a memory 120, a graphical user interface (GUI) 130, and a network interface 140. Reservoir simulator 110 includes a data analyzer 112, a model builder 114, and a data visualizer 116. Memory 120 may be used to store treatment data 122 and wellsite data 124. In an embodiment, reservoir simulator 110 and its components (data analyzer 112, model builder 114, and data visualizer 116), memory 120, GUI 130, and network interface 140 may be communicatively coupled to one another via, for example, an internal bus of computer system 100.

In an embodiment, system 100 can be implemented using any type of computing device having one or more processors, a user input (for example, a mouse, QWERTY keyboard, touch-screen, a graphics tablet, or microphone), and a communications infrastructure capable of receiving and transmitting data over a network. Such a computing device can be, for example and without limitation, a mobile phone, a personal digital assistant (PDA), a tablet computer, a laptop computer, a desktop computer, a workstation, a cluster of computers, a set-top box, or other similar type of device capable of processing instructions and receiving and transmitting data to and from humans and other computing devices. Although only reservoir simulator 110, memory 120, GUI 130, and network interface 140 are shown in FIG. 1, it would be apparent to a person skilled in the relevant art that system 100 may include additional components, modules, and/or sub-components as desired for a particular implementation.

Reservoir simulator 110 and its components (data manager 112, model builder 114, and data visualizer 116), can be implemented in software, firmware, hardware, or any combination thereof. Furthermore, embodiments of 3D data analyzer 112, model builder 114, and data visualizer 116, or portions thereof, can be implemented to run on any type of processing device including, but not limited to, a computer, workstation, embedded system, networked device, mobile device, or other type of processor or computer system capable of carrying out the functionality described herein.

Memory 120 can be used to store information (e.g., treatment data 122 and wellsite data 124) accessible by reservoir simulator 110 for performing detection of the crossflow and quantification of crossflow effects on fluid distribution during multistage injection treatments of hydrocarbon bearing reservoir formations of the present disclosure. Memory 120 may be any type of recording medium coupled to an integrated circuit that controls access to the recording medium. The recording medium can be, for example and without limitation, a semiconductor memory, a hard disk, or other similar type of memory or storage device. Moreover, memory 120 may be integrated within system 100 or an external device communicatively coupled to system 100. In some implementations, memory 120 may be a remote cloud-based storage location communicatively coupled to system 100 over a network 104 via network interface 140.

Network 104 can be any type of network or combination of networks used to communicate information between different computing devices. Network 104 can include, but is not limited to, a wired (e.g., Ethernet) or a wireless (e.g., Wi-Fi and 3G) network. In addition, network 104 can include, but is not limited to, a local area network, medium area network, and/or wide area network such as the Internet.

In an embodiment, reservoir simulator 110 uses GUI 130 to receive input from a user 102 via a user input device (not shown), e.g., a mouse, keyboard, microphone, or touch-screen display. GUI 130 may also be used to present information to user 102 based on the received input. The information may be presented to user 102 via a display (not shown) coupled to system 100. The display may be, for example and without limitation, a cathode ray tube (CRT) monitor, a liquid crystal display (LCD), or a touch-screen display, e.g., in the form of a capacitive touch-screen light emitting diode (LED) display. GUI 130 may be provided to user 102 by, for example, an application executable at system 100.

In an embodiment, data visualizer 116 receives input from user 102 and GUI 130. Data visualizer 116 may enable user 102 to create a two-dimensional (2D) or three-dimensional (3D) graphical representation of a well site. The 2D or 3D graphical representation of the well site displayed to user 102 via GUI 130 may be based on, for example, information stored in memory 120 within wellsite data 124.

In an embodiment, model builder 114 of reservoir simulator 110 may utilize treatment data 122 and wellsite data 124 to generate a forward model comprising a fluid placement simulator. Model builder 114 may be also configured to upgrade the forward model within reservoir simulator 110 to simulate wellbore crossflow and reservoir heat transfer. In an embodiment, the forward model may be designed for simulating different stages of a multistage injection treatment of a reservoir formation. In an embodiment, data analyzer 112 of reservoir simulator 110 may analyze treatment data 122 and wellsite data 124 for simulating wellbore crossflow and reservoir heat transfer at the forward model of reservoir simulator 110.

As noted above, the techniques disclosed herein may be used to detect crossflow and quantify crossflow effects on fluid distribution during stimulation (fluid injection) treatments of hydrocarbon bearing reservoir formations. As will be described in further detail below, the disclosed techniques may include using a near wellbore reservoir simulator (e.g., the reservoir simulator 110 in FIG. 1, as described above) and an inversion process for detecting crossflow and quantifying its effects on fluid distribution during a low rate injection stage inserted after a main or primary (high rate) injection stage of a multistage fluid injection stimulation treatment.

In one or more embodiments, the near wellbore reservoir simulator can include a forward model with an inversion tool for interpretation of wellbore temperature measurements. The wellbore temperature measurements are commonly obtained through distributed temperature sensing (DTS). In an embodiment, the near wellbore reservoir simulator model is a fluid placement simulator, which models wellbore crossflow and wellbore-reservoir heat transfer.

In one or more embodiments, the low rate injection stage may be inserted after the main (high rate) injection stage. During the low rate injection stage, a small volume of fluid may be pumped at a rate substantially lower than an injection rate of the main injection stage. The purpose of the low rate injection stage is to allow any crossflow that may occur during a treatment interval to be detectable with temperature measurements. In an embodiment, the low rate injection stage may be a shut-in stage.

In one or more embodiments, the wellbore temperature rise due to crossflow during the low rate injection stage may be dependent on the reservoir temperature distribution at the end of the main injection stage. The reservoir temperature distribution in turn may be governed by the existence/absence of crossflow during the main injection stage itself. The relationship between the wellbore temperature rise during the low rate injection stage and extent of crossflow during the main injection stage can be used in the inversion process presented herein. The low rate injection stage does not alter the reservoir properties (permeability, porosity, and the like). Hence, the low rate injection stage differs from an acid stage or a diverter stage.

In one or more embodiments, an initial fluid distribution profile may be adjusted and refined based on a comparison between simulated and measured temperatures for the main (or high rate) injection and low rate injection stages of the multistage treatment. For example, the inversion process presented in this disclosure may be used to refine the initial fluid distribution profile and thereby, determine a more accurate estimate of fluid distribution for the main injection stage that not only matches temperatures measured at the end of the main injection stage but also matches temperatures measured during the low rate injection stage. This also helps to ensure that the estimated fluid distribution at the end of the main injection stage is corrected for any crossflow that might have occurred during the high-rate fluid injection of the main stage. The refined fluid distribution profile may then be used to perform subsequent stages of the multistage treatment. Advantages of the disclosed techniques include more accurate quantification of crossflow effects and thus, accurate estimation/analysis of the extent of stimulation treatment (e.g., skin change), which is typically governed by the fluid distribution.

Figure 2:
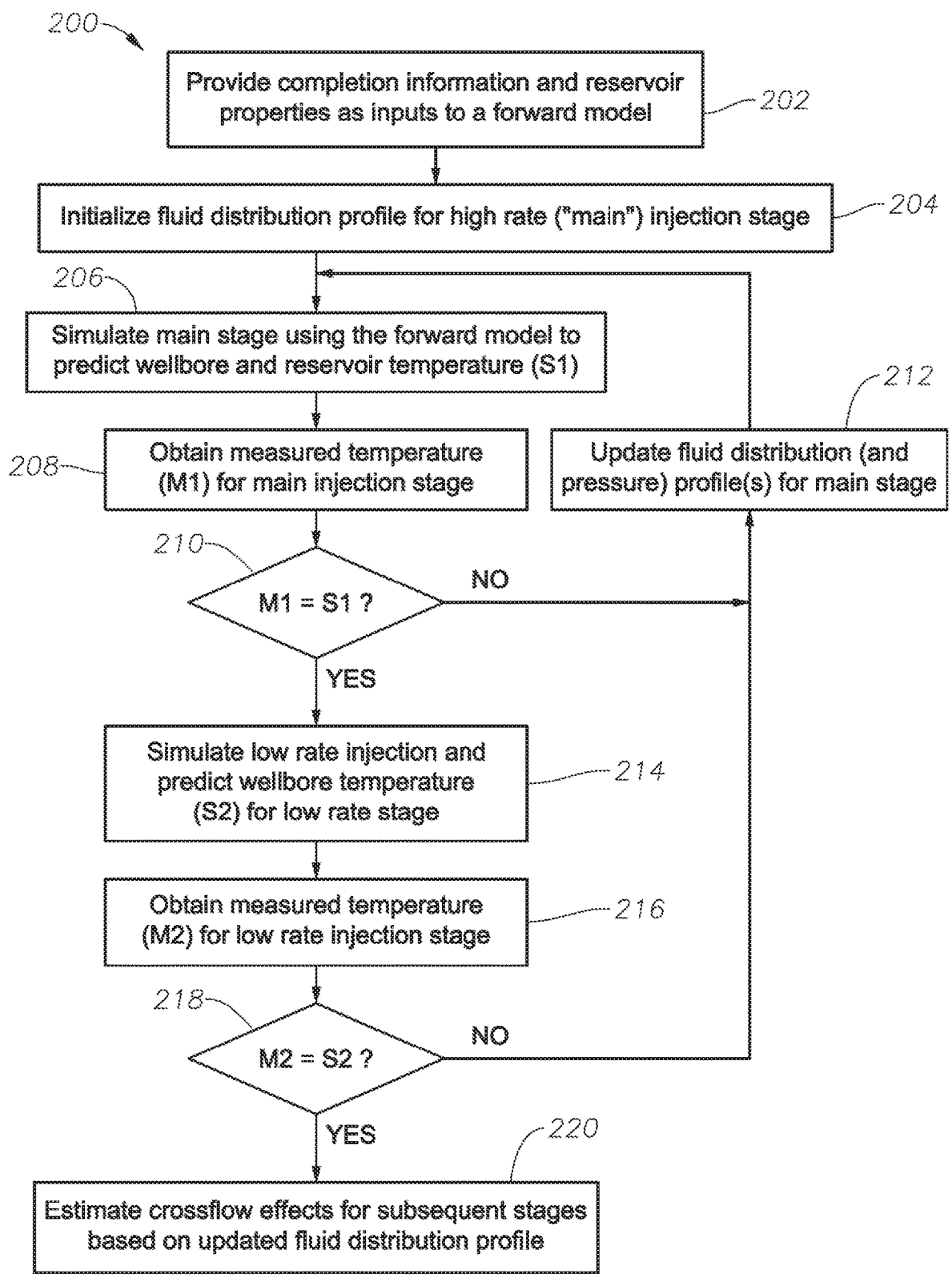
FIG. 2 is a flow diagram of an illustrative method for detection of crossflow and quantification of crossflow effects on fluid distribution during a stimulation treatment of a hydrocarbon bearing reservoir formation.

FIG. 2 is a flow diagram of an illustrative method 200 for detecting crossflow and quantifying crossflow effects on fluid distribution during a stimulation (e.g., fluid injection) treatment of a hydrocarbon bearing reservoir formation. At 202, completion information and reservoir properties may be provided as inputs to a forward model configured to simulate different stages of a multistage stimulation injection treatment of the reservoir formation. At 204, a fluid distribution profile for a high-rate (or "main") injection stage may be initialized. It should be noted that while this high-rate injection stage of the multistage treatment is referred to herein as a "main" stage, the disclosed embodiments are not intended to be limited to just a single main stage and that there may be multiple main stages over the course of the multistage treatment in which fluid is injected via a wellbore into the formation at a relatively high rate of injection. At 206, the main injection stage may be simulated by using the forward model to obtain simulated data S1, which may include estimated or predicted wellbore and/or reservoir temperatures associated with the main injection stage. At 208, an actual wellbore/reservoir temperature (M1) measured for the main injection stage may be obtained. In one or more embodiments, the data set M1 may comprise measured temperatures along the length of the wellbore. This temperature measurement may have been acquired, for example, at some time towards the end of or after the main injection stage, and before the beginning of the low rate injection stage following the main injection stage. It should be appreciated that in addition to temperature, other wellbore/reservoir properties may also be measured along the length of the wellbore and simulated during the various stages of the multistage treatment described herein. It should also be appreciated that while method 200 is described with respect to temperature measurements, embodiments of the present disclosure are not intended to be limited thereto and that the disclosed embodiments may be applied to any of various wellbore/reservoir properties that may be measured or simulated for purposes of crossflow detection and estimation.

At a decision block 210, the measured data set M1 (e.g., measured temperatures along the length of the wellbore towards the end of the main injection stage) may be compared with the simulated data S1 (e.g., the wellbore temperature data obtained by simulating the main injection stage by using the forward model). If it is determined from the comparison that the measured data M1 does not match the simulated data S1, then simulated fluid distribution and pressure profile associated with the main injection stage may be updated, at 212, based on the difference between the measured (M1) and simulated (S1) data. The main injection stage may be simulated again, at 206, by using the forward model based on the updated fluid distribution (and any related pressure) profile(s) to obtain updated simulated data S1 (e.g., updated simulated wellbore temperature data associated with the main injection stage). As illustrated in FIG. 2, the simulation (206), measurement (208), comparison (210), and fluid distribution profile updates (212) may be repeated, until the simulated/estimated temperature data S1 matches the measured temperature data M1 obtained for the main injection stage. This helps to ensure that the fluid distribution profile has been sufficiently updated or adjusted to minimize error and improve its accuracy for subsequent simulations of treatment stages following the current high-rate (main) injection stage.

Once the measured data M1 and the simulated data S1 are matched, the low rate injection stage may be simulated (e.g., by the forward model), and simulated data S2 (e.g., wellbore temperature estimates) for the low rate injection stage may be predicted, at 214. At 216, data set M2 (e.g., actual wellbore temperature measurements) for the low rate injection stage may be obtained. In one or more embodiments, the data set M2 may comprise wellbore temperatures measured over a period of time including the point at which the occurrence of any crossflow becomes detectable during the low rate injection stage. In an embodiment, the presence of crossflow may be established based on a sudden temperature increase detected at some point during the low rate injection stage (e.g., as shown in FIG. 4B, described in further detail below). For example, such a crossflow point may be detected from the measurements M2 (e.g., measured temperature data) obtained for a portion of the wellbore at or shortly after the beginning of the low rate injection stage. The corresponding simulated wellbore temperature data S2 may be obtained from the upgraded forward model.

At a decision block 218, the measured data M2 (e.g., measured wellbore temperatures for the low rate injection stage) may be compared with the simulated data S2 (e.g., the wellbore temperature data obtained from the forward model by simulating the low rate injection stage). As illustrated in FIG. 2, if the measured data M2 does not match the simulated data S2, simulated fluid distribution and pressure profile associated with the main injection stage may be updated, at 212. Then, the main injection stage may be again simulated, at 206, by using the forward model based on the updated fluid distribution and pressure profile to obtain updated simulated data S1 (e.g., the updated simulated wellbore temperature data towards the end of the main injection stage). Once the measured data M1 and the simulated data S1 are matched, the low rate injection may be simulated and the simulated data S2 for the low rate injection stage may be predicted again, at 214.

As illustrated in FIG. 2, the simulated fluid distribution and pressure profile for the main injection stage may continue to be updated, at 212, until the data M1 measured towards the end of the main injection stage match the simulated data S1 and until the data M2 measured at the end of the low rater injection stage match the simulated data S2. In an embodiment of the present disclosure, adjusting the simulated fluid distribution at the end of the main injection stage to match measured data set M1 with simulated data S1 and measured data set M2 with simulated data S2 may be achieved using squared error minimization optimization. In one or more embodiments, the multistage stimulation (e.g., fluid injection) treatment may comprise one or more main injection stages and one or more low rate injection stages. For each injection stage 'n', a measured data set Mn may comprise P measured data points $Mn_j$ (j=1, . . . , P). Similarly, for each injection stage 'n', a simulated data set Sn may comprise P simulated data points $Sn_j$ (j=1, . . . , P). Then, the squared error between measured data $Mn_j$ and simulated data $Sn_j$ (j=1, . . . , P) for a particular injection stage 'n' to be minimized may be defined as $$\sum_{j=1}^{P} (Mn_j - Sn_j)^2.$$

Any other suitable non-linear optimization algorithm may also be used.

At 220, the updated fluid distribution profile may be used to estimate the potential crossflow effects for subsequent stages of the multistage treatment in this example. This updated fluid distribution profile may be obtained as a result of iteratively repeating operations 206-218 until the measured data matches the simulated data for the high rate (or main) and low rate injection stages of the treatment. Accordingly, the updated fluid distribution profile may represent an optimized or refined fluid distribution profile that accounts for the crossflow that may be likely to occur during the subsequent stages of the multistage treatment. In other words, the fluid distribution profile at block 220 may quantify potential crossflow effects for purposes of planning subsequent treatment stages. In some embodiments, block 220 may include performing an analysis of the stimulation treatment's effectiveness for improving hydrocarbon production from the reservoir based on the fluid distribution profile, and one or more subsequent stages of the multistage stimulation treatment may be performed based on the analysis of the treatment effectiveness. The mitigation of the crossflow effects estimated from the fluid distribution profile at block 220 may be performed during, for example, a shut-in stage of the multistage stimulation treatment, which may correspond to a low rate injection stage of the treatment or may follow a separate low rate injection stage.

The effects of crossflow on wellbore/reservoir temperature measurements during the above-described multistage treatment for a reservoir layer may be explained by dividing the reservoir layer into different regions according to the extent of the crossflow that may occur in each region. For example, the reservoir layer may be divided into two regions that may have different temperature profiles based on each region's proximity to the wellbore. In the presence of crossflow during the main injection stage, a first region of the reservoir layer, closest to the wellbore, may get cooler over time while a second region, farther from the wellbore, may get warmer over time. The length of these regions may depend on the extent of crossflow, i.e., if the crossflow is higher, then the first region is shorter, and thus the second region gets longer.

In one or more embodiments, when the low rate injection stage is included into the injection treatment process, the wellbore temperature may increase due to the hot fluid coming into the wellbore from the reservoir. The rate of the wellbore temperature rise may depend on the amount of fluid entering the wellbore and the length of the first and second regions as mentioned above. With time, the amount of fluid entering may be constant but the length of the regions may change (e.g., due to convective heat transfer). Hence, the rate of increase in wellbore temperature (i.e., the derivative of temperature) may gradually reduce. The decrease in the derivative of the temperature may be a function of the length of the first region. Thus, the rate of increase of wellbore temperature during the low rate injection stage may be dependent of the length of the region developed at the end of the main injection stage, which in turn is a measure of the extent of crossflow during the main injection stage.

An illustrative use case of the detection and quantification of crossflow effects on fluid distribution during a multistage fluid injection treatment will now be described in reference to FIGS. 3A, 3B, 4A and 4B. At a first injection stage of the multistage injection treatment, water may be injected (e.g., the volume of 5000 gallons) at the injection rate of 4 bpm (barrels per minute). Then, for a given set of completion parameters and reservoir properties, a fluid acid (e.g., 5000 gallons of 15% hydrochloric acid HCl) may be injected at 4 bpm, at a second injection stage. This fluid acid stage may be followed by the flush stage where the volume of 5000 gallons of Gelled Brine is injected at the injection rate of 4 bpm. The fluid acid and flush stages may represent parts of the high rate (or main) injection stage of the multistage treatment in this example. Thereafter, a low rate injection stage can be inserted, wherein the low rate injection pulse (e.g., the volume of 500 gallons) may be injected at the injection rate of 1 bpm. Following the low rate injection stage, the displacement water may be injected (e.g., the volume of 7256 gallons) at the injection rate of 4 bpm.

Figure 3A:
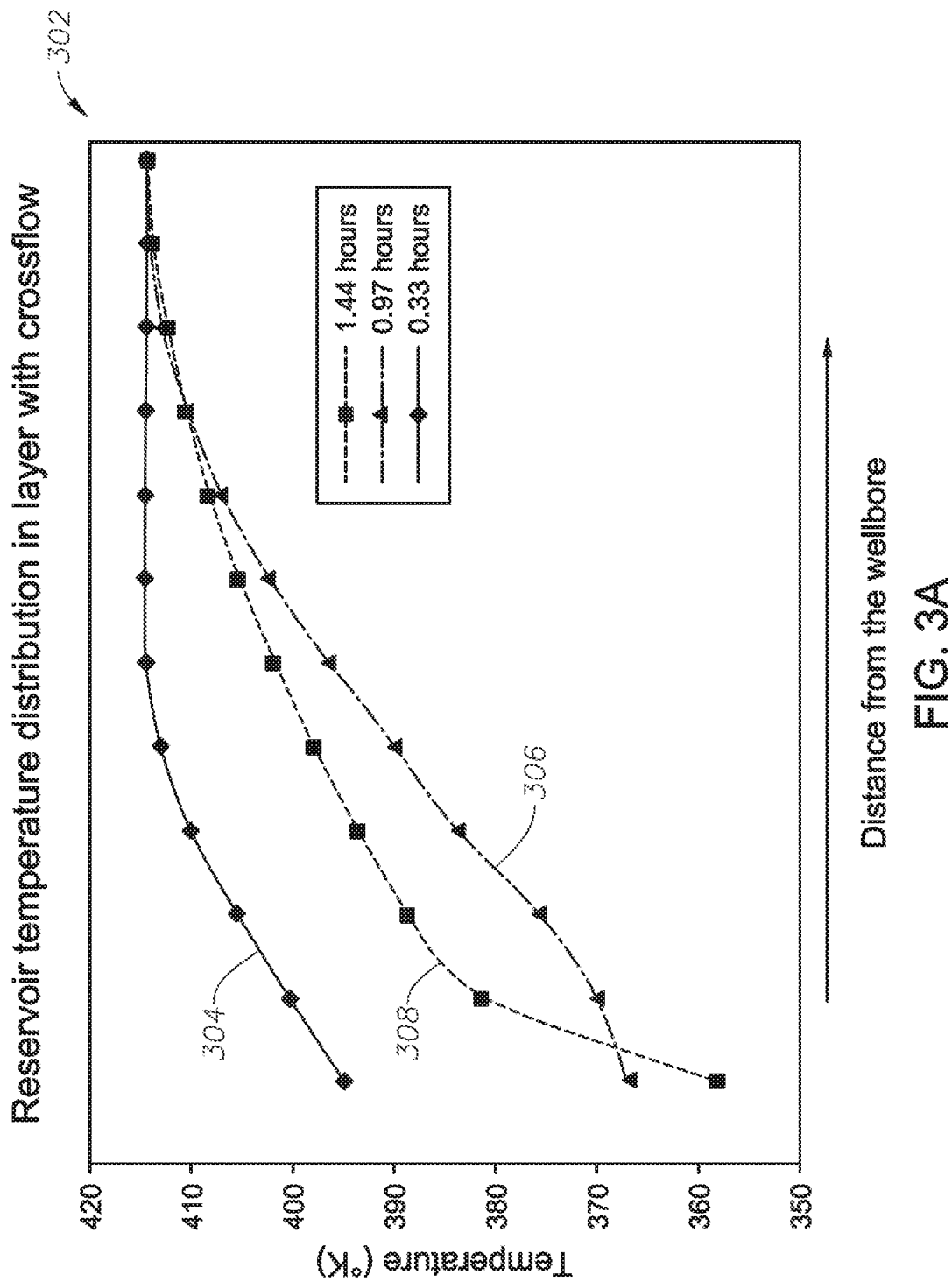
FIG. 3A is a plot graph that shows an example of a crossflow effect on reservoir temperature distribution relative to distance from a wellbore.

FIG. 3A shows an example of the effects of crossflow on reservoir temperature distribution, according to certain embodiments of the present disclosure. The graph 302 in FIG. 3A shows simulated reservoir temperature distribution over time in a layer with crossflow, corresponding to the main injection stage. There is no crossflow between 0.33 hours from the beginning of fluid injection (e.g., reservoir temperature distribution 304 as a function of distance from the wellbore) and 0.97 hours from the beginning of fluid injection (e.g., reservoir temperature distribution 306 as a function of distance from the wellbore). Hence, during this time period, the reservoir takes cold fluid and gets cooled down. However, after 1.05 hours from the beginning of fluid injection (e.g., reservoir temperature distribution 308), the crossflow starts and fluid flows back into the wellbore. Then, the temperature inside the reservoir increases over time due to convective heat transfer. However, the rate of production of hot fluid is low compared to the injection rate of main injection stage, and therefore, the wellbore temperature is dominated by the injected fluid. This results in cool-down of the layer at the interface but warming in the inner region of the reservoir layer.

Figure 3B:
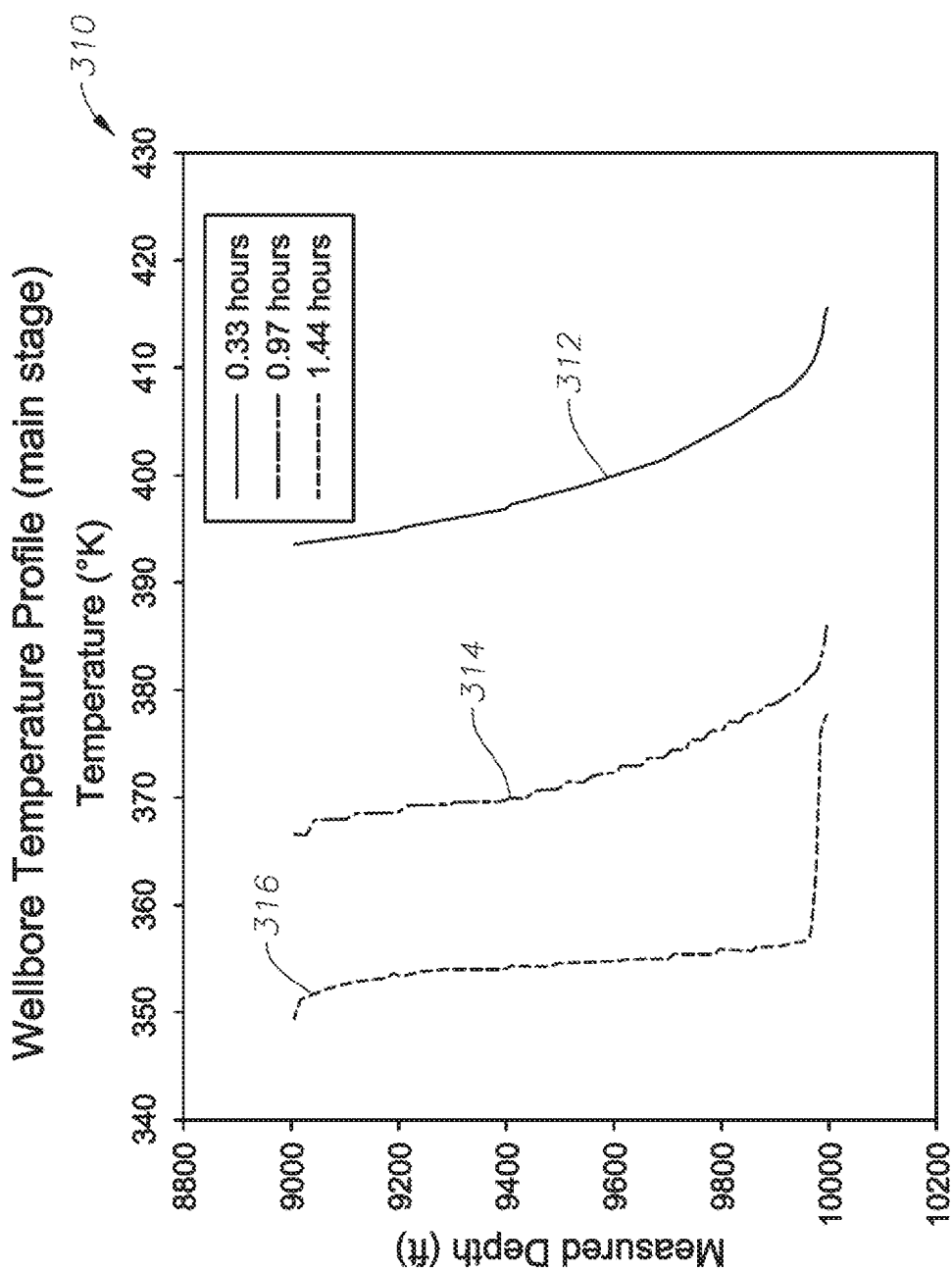
FIG. 3B is a line graph that shows an example of a crossflow effect on wellbore temperature distribution.

FIG. 3B shows an example of crossflow effects on wellbore temperature distribution. The graph 310 in FIG. 3B shows an example wellbore temperature profile (for different measured depths) over time during the main injection stage. Similarly as for the simulated reservoir temperature distribution, measured wellbore temperature (e.g., temperature profiles 312, 314, and 316 for 0.33 hours, 0.97 hours, and 1.44 hours from the beginning of fluid injection, respectively) can suggest cool down of the layer over time, while the inner regions of layer are getting warm. Thus, the crossflow can occur in the wellbore without being noticeable on the wellbore temperature profile.

Figure 4A:
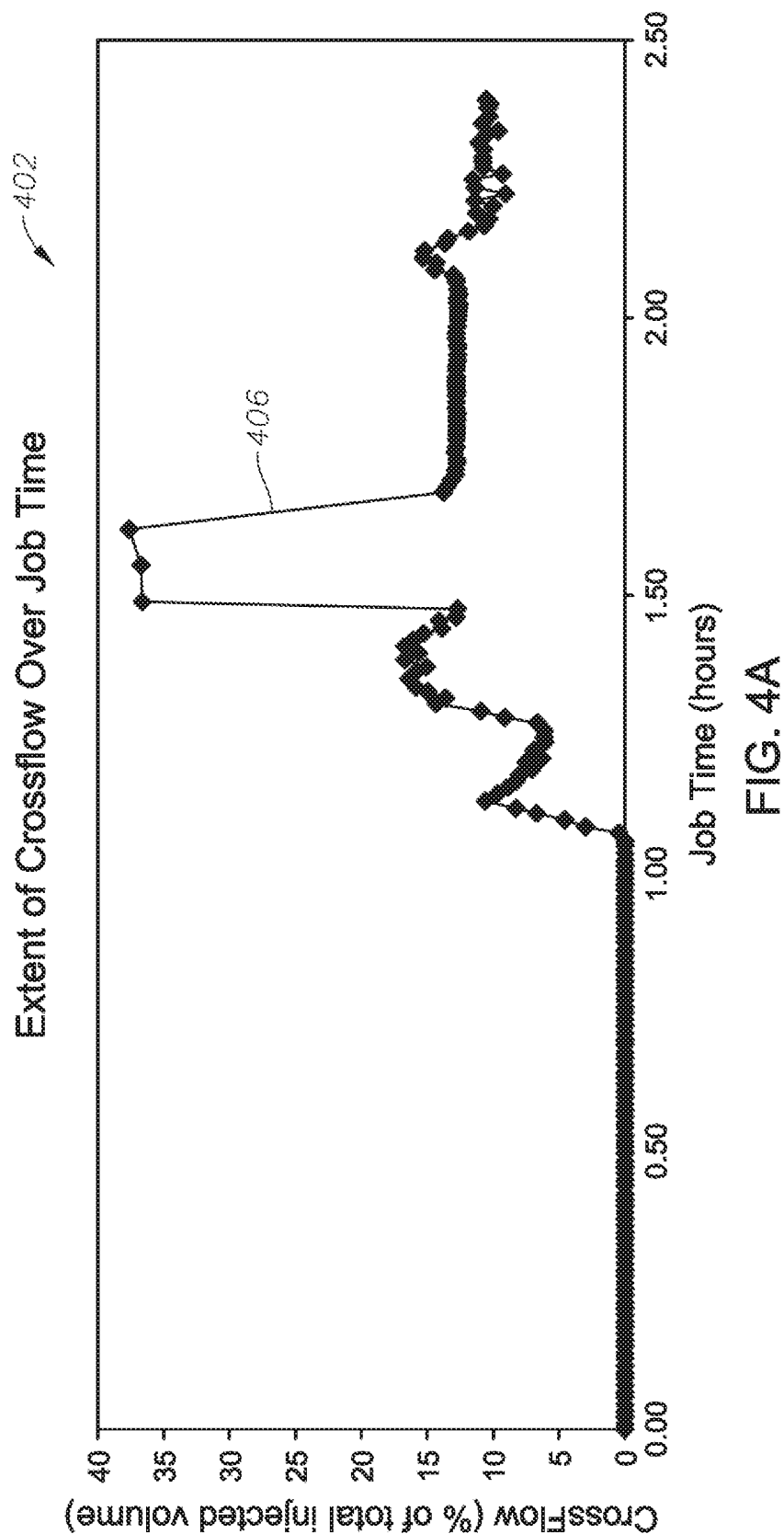
FIG. 4A is another plot graph that shows an example of the extent of crossflow during a fluid injection treatment.
Figure 4B:
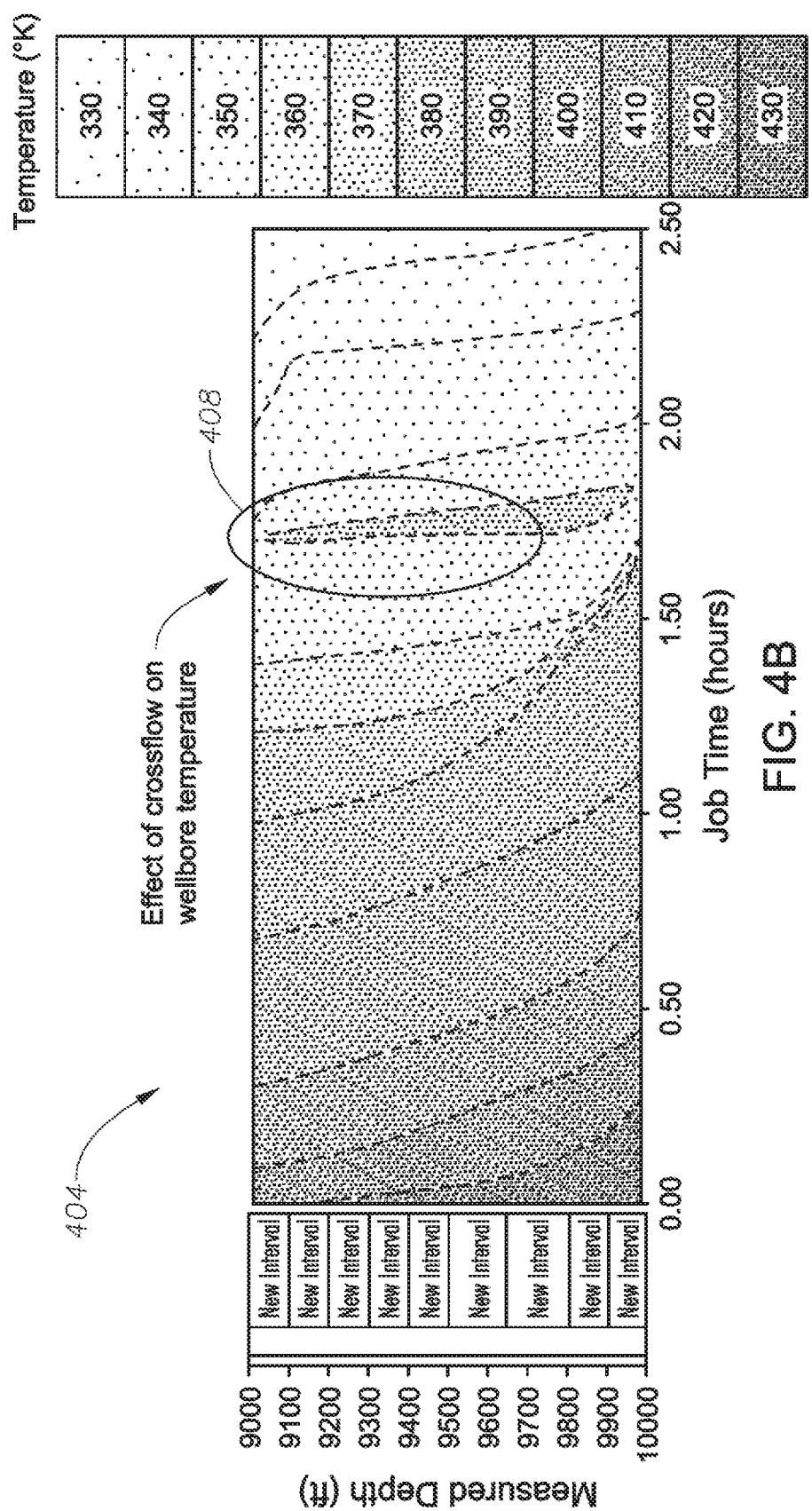
FIG. 4B is a temperature chart that shows an example of the effect of crossflow on wellbore temperature as it changes over time during a fluid injection treatment.

FIG. 4A shows an example of the extent of crossflow during a fluid injection treatment, and FIG. 4B shows an example of simulated wellbore temperature variation over time and how it is affected by crossflow that occurs during the fluid injection treatment. The graph 402 in FIG. 4A shows an amount (extent) of crossflow as a percentage of total injected volume during the injection treatment interval. The graph 404 in FIG. 4B shows the wellbore temperature over time during the same injection treatment interval. By comparing the graphs 402 and 404, it can be observed that low crossflow rates do not have a noticeable effect on the wellbore temperature, i.e., the wellbore temperature decreases over time. As soon as the low injection rate stage is applied as a part of the multistage injection treatment process, the warm fluid coming from the formation dominates the wellbore temperatures at the point of inflow. Hence, a sharp rise in the wellbore temperature can be observed at the location of inflow (e.g., the crossflow 406 in FIG. 4A affects the wellbore temperature as shown in the area 408 of the temperature distribution graph 404 in FIG. 4B).

In one or more embodiments, the observed wellbore temperature rise may depend on the temperature of the fluid coming into the wellbore from the reservoir formation. If there is no crossflow during the main injection stage, the reservoir would cool down and the temperature rise during the low rate injection stage would be low. However, if the crossflow occurs during injection interval of the main injection stage, the reservoir will get warmed in the inner regions and the temperature rise during the low rate injection stage following the main injection stage will be high. Hence, the temperature increase during the low rate injection stage may depend on the presence of crossflow during the main injection stage. Thus, the wellbore temperature increase during the low rate injection stage can be used in the inversion process (e.g., the inversion process based on the framework 200 illustrated in FIG. 2) to quantify crossflow effects during fluid injection of the main injection stage.

Figure 5:
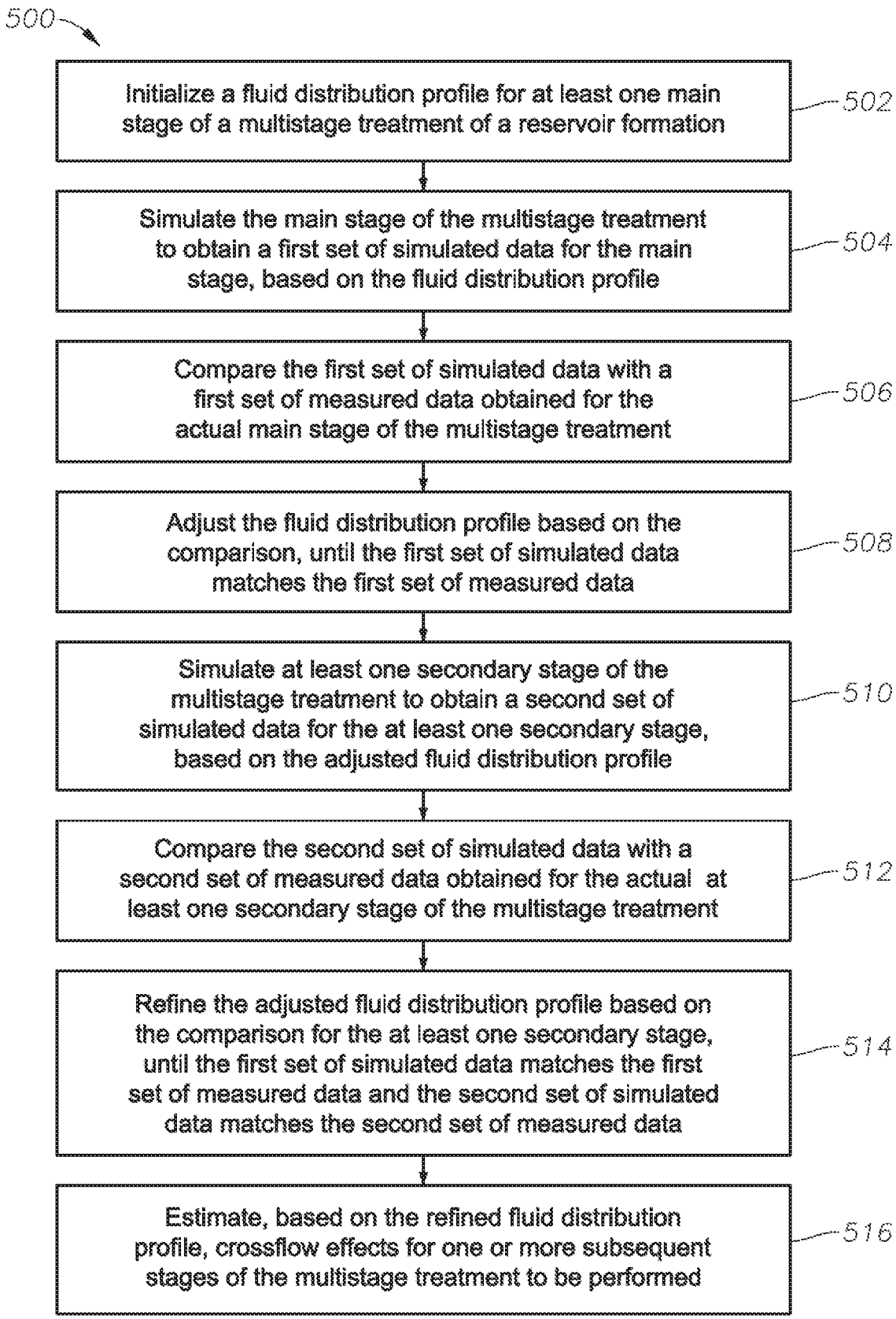
FIG. 5 is a flow chart of an illustrative method for detection of crossflow and quantification of crossflow effects on fluid distribution during a multistage injection treatment of a hydrocarbon bearing reservoir formation.

Discussion of an illustrative method of the present disclosure will now be made with reference to FIG. 5, which is a flow chart of a method 500 for detecting the crossflow and quantifying crossflow effects on fluid distribution during a stimulation treatment of a hydrocarbon bearing reservoir formation, according to certain embodiments of the present disclosure. The method begins at 502, by initializing a fluid distribution profile for at least one main stage of a multistage treatment of a reservoir formation. At 504, the main stage of the multistage treatment (e.g., the main or high rate injection stage) may be simulated to obtain a first set of simulated data for the main stage (e.g., the simulated data S1 of the inversion framework 200 illustrated in FIG. 2), based on the fluid distribution profile. At 506, the first set of simulated data may be compared with a first set of measured data (e.g., data set M1 in FIG. 2) obtained for the actual main stage of the multistage treatment (e.g., for the actual main or high rate injection stage). At 508, the fluid distribution profile may be adjusted based on the comparison for the main stage, until the first set of simulated data matches the first set of measured data (e.g., until the simulated data S1 match the measured data set M1). At 510, a secondary stage of the multistage treatment (e.g., a low rate injection stage) may be simulated to obtain a second set of simulated data for the secondary stage (e.g., the simulated data S2 in FIG. 2), based on the adjusted fluid distribution profile, the secondary stage having a relatively lower fluid injection rate than that of the main stage. It should be noted that the secondary stage of the multistage treatment (e.g., the low rate injection stage) does not alter permeability of the reservoir formation. In other words, the secondary (low rate injection) stage is neither an acid stage nor a diverter stage.

At 512, the second set of simulated data may be compared with a second set of measured data (e.g., data set M2 in FIG. 2) obtained for the actual secondary stage of the multistage treatment (e.g., for the actual low rate injection stage). At 514, the adjusted fluid distribution profile may be refined based on the comparison for the secondary stage, until the first set of simulated data matches the first set of measured data and the second set of simulated data matches the second set of measured data (e.g., until the simulated data S1 match the measured data set M1 and the simulated data S2 match the measured data set M2 in FIG. 2). At 516, crossflow effects for one or more subsequent stages of the multistage treatment to be performed may be estimated based on the refined fluid distribution profile. As described above, the refined fluid distribution profile may account for and quantify the detected crossflow that occurred during the main stage of the multistage treatment (e.g., the high rate or "main" injection stage).

The present disclosure describes the method to determine and quantify crossflow during fluid injection treatments, which allows accurate estimation of fluid distribution and stimulation. While data collected during a post-treatment shut-in may be utilized for quantifying crossflow, the quantification of crossflow based on such data allows the detection of crossflow only during the shut-in stage, and cannot be used to determine the extent of crossflow during high rate fluid injection stages of the treatment. In contrast with such conventional solutions for detecting crossflow, embodiments of the present disclosure allow the detection and quantification of the crossflow that is expected to occur during the high rate (main) injection stage(s). Moreover, the disclosed embodiments provide a way for crossflow to be detected in standard temperature measurements, where it would otherwise go unnoticed using conventional solutions.

Also, unlike other conventional solutions that use a thermal tracer requiring an external chemical agent to generate an exothermic/endothermic reaction for detection and quantification of crossflow during fluid injection, the disclosed embodiments allow such crossflow to be detected and quantified without any additional chemical reaction in the wellbore.

Some methods can be used to determine fluid distribution for a given injection stage based on temperature measurements for either that stage alone or measurements used during a post treatment shut-in stage alone. In the present disclosure, a novel inversion method is utilized in which fluid distribution for the main injection stage is based on temperature measurements for the main injection stage as well as on temperature measurement during a subsequent low rate injection stage. The approach presented in this disclosure gives a more accurate fluid distribution by accounting for effects of crossflow, if any.

Advantages of the present disclosure include, but are not limited to, real time optimization of diversion treatment design, more efficient matrix acidizing treatment in heterogeneous reservoirs, and more accurate matrix acid job design for reservoir with high degree of heterogeneities. Fluid placement in wells where crossflow occurs during fluid injection can be problematic. Diversion methods can be used to overcome crossflow effects once the extent and location is known. Estimation of potential crossflow during injection from shut-in data can be used to design diversion treatments. The method presented in this disclosure allows a more accurate quantification of crossflow during injection and optimization of the diversion treatment in real-time.

Furthermore, the crossflow can occur during stimulation due to opening of low pressure zones. Wellbore temperature measurements may not show evidence of crossflow during injection. Shut-in data may allow detection of crossflow, but cannot quantify crossflow if it occurs during the main treatment stage. The method presented in this disclosure allows quantification of crossflow that could have occurred during the main treatment stage in real time, allowing more efficient treatment execution and analysis.

Figure 6:
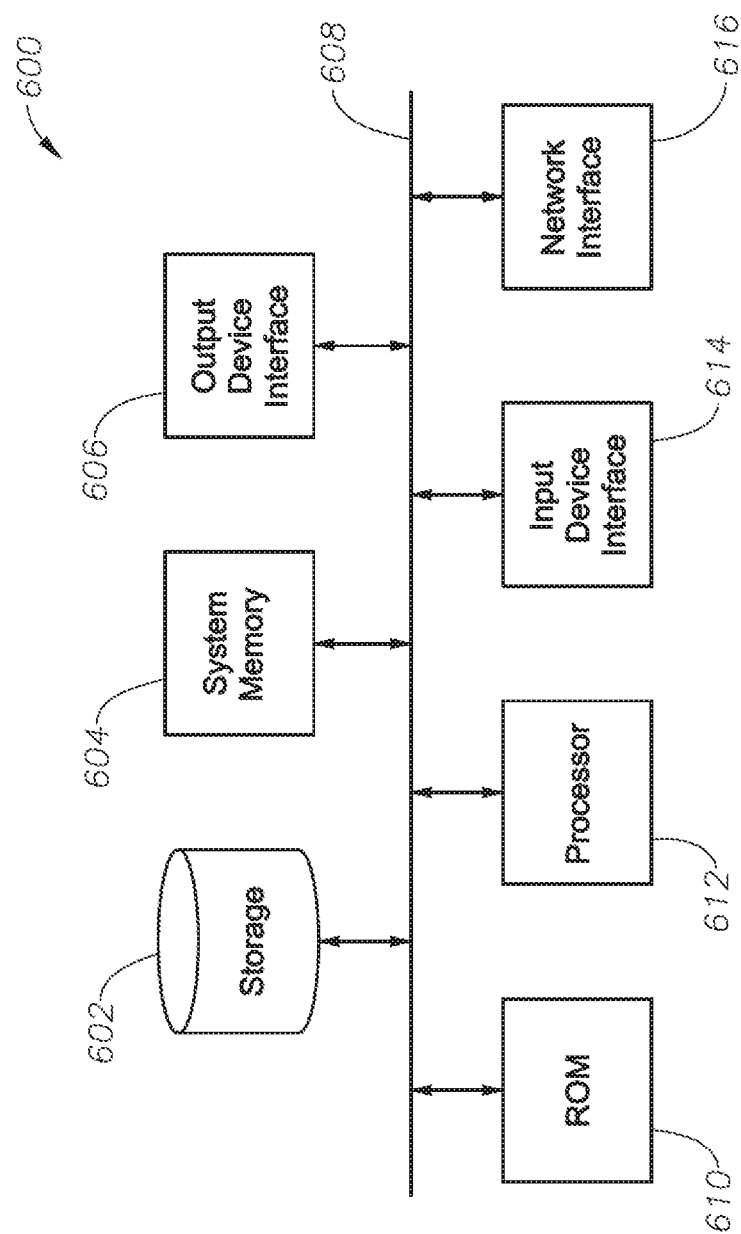
FIG. 6 is a block diagram of an illustrative computer system in which embodiments of the present disclosure may be implemented.

FIG. 6 is a block diagram of an illustrative computer system 600 in which embodiments of the present disclosure may be implemented adapted for quantification of crossflow effects on fluid distribution during stimulation treatments of hydrocarbon bearing reservoir formations. For example, the operations of framework 200 from FIG. 2 and the operations of method 500 of FIG. 5, as described above, may be implemented using system 600. System 600 can be a computer, phone, personal digital assistant (PDA), or any other type of electronic device. Such an electronic device includes various types of computer readable media and interfaces for various other types of computer readable media. As shown in FIG. 6, system 600 includes a permanent storage device 602, a system memory 604, an output device interface 606, a system communications bus 608, a read-only memory (ROM) 610, processing unit(s) 612, an input device interface 614, and a network interface 616.

Bus 608 collectively represents all system, peripheral, and chipset buses that communicatively connect the numerous internal devices of system 600. For instance, bus 608 communicatively connects processing unit(s) 612 with ROM 610, system memory 604, and permanent storage device 602.

From these various memory units, processing unit(s) 612 retrieves instructions to execute and data to process in order to execute the processes of the subject disclosure. The processing unit(s) can be a single processor or a multi-core processor in different implementations.

ROM 610 stores static data and instructions that are needed by processing unit(s) 612 and other modules of system 600. Permanent storage device 602, on the other hand, is a read-and-write memory device. This device is a non-volatile memory unit that stores instructions and data even when system 600 is off. Some implementations of the subject disclosure use a mass-storage device (such as a magnetic or optical disk and its corresponding disk drive) as permanent storage device 602.

Other implementations use a removable storage device (such as a floppy disk, flash drive, and its corresponding disk drive) as permanent storage device 602. Like permanent storage device 602, system memory 604 is a read-and-write memory device. However, unlike storage device 602, system memory 604 is a volatile read-and-write memory, such a random access memory. System memory 604 stores some of the instructions and data that the processor needs at runtime. In some implementations, the processes of the subject disclosure are stored in system memory 604, permanent storage device 602, and/or ROM 610. For example, the various memory units include instructions for performing operations described herein to obtain quantification of crossflow effects on fluid distribution during stimulation treatments of hydrocarbon bearing reservoir formations in accordance with some implementations. From these various memory units, processing unit(s) 612 retrieves instructions to execute and data to process in order to execute the processes of some implementations.

Bus 608 also connects to input and output device interfaces 614 and 606. Input device interface 614 enables the user to communicate information and select commands to system 600. Input devices used with input device interface 614 include, for example, alphanumeric, QWERTY, or T9 keyboards, microphones, and pointing devices (also called "cursor control devices"). Output device interfaces 606 enables, for example, the display of images generated by system 600. Output devices used with output device interface 606 include, for example, printers and display devices, such as cathode ray tubes (CRT) or liquid crystal displays (LCD). Some implementations include devices such as a touchscreen that functions as both input and output devices. It should be appreciated that embodiments of the present disclosure may be implemented using a computer including any of various types of input and output devices for enabling interaction with a user. Such interaction may include feedback to or from the user in different forms of sensory feedback including, but not limited to, visual feedback, auditory feedback, or tactile feedback. Further, input from the user can be received in any form including, but not limited to, acoustic, speech, or tactile input. Additionally, interaction with the user may include transmitting and receiving different types of information, e.g., in the form of documents, to and from the user via the above-described interfaces.

Also, as shown in FIG. 6, bus 608 also couples system 600 to a public or private network (not shown) or combination of networks through a network interface 616. Such a network may include, for example, a local area network ("LAN"), such as an Intranet, or a wide area network ("WAN"), such as the Internet. Any or all components of system 600 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself. Accordingly, the operations of framework 200 from FIG. 2 and the operations of method 500 of FIG. 5, as described above, may be implemented using system 600 or any computer system having processing circuitry or a computer program product including instructions stored therein, which, when executed by at least one processor, causes the processor to perform functions relating to these methods.

As used in this specification and any claims of this application, the terms "computer", "server", "processor", and "memory" all refer to electronic or other technological devices. These terms exclude people or groups of people. As used herein, the terms "computer readable medium" and "computer readable media" refer generally to tangible, physical, and non-transitory electronic storage mediums that store information in a form that is readable by a computer.

Embodiments of the subject matter described in this specification can be implemented in a computing system that includes a back end component, e.g., a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a web page) to a client device (e.g., for purposes of displaying data to and receiving user input from a user interacting with the client device). Data generated at the client device (e.g., a result of the user interaction) can be received from the client device at the server.

It is understood that any specific order or hierarchy of operations in the processes disclosed is an illustration of exemplary approaches. Based upon design preferences, it is understood that the specific order or hierarchy of operations in the processes may be rearranged, or that all illustrated operations be performed. Some of the operations may be performed simultaneously. For example, in certain circumstances, multitasking and parallel processing may be advantageous. Moreover, the separation of various system components in the embodiments described above should not be understood as requiring such separation in all embodiments, and it is should be understood that the described program components and systems can generally be integrated together in a single software product or packaged into multiple software products.

Furthermore, the illustrative methods described herein may be implemented by a system including processing circuitry or a computer program product including instructions which, when executed by at least one processor, causes the processor to perform any of the methods described herein.

Figure 7:
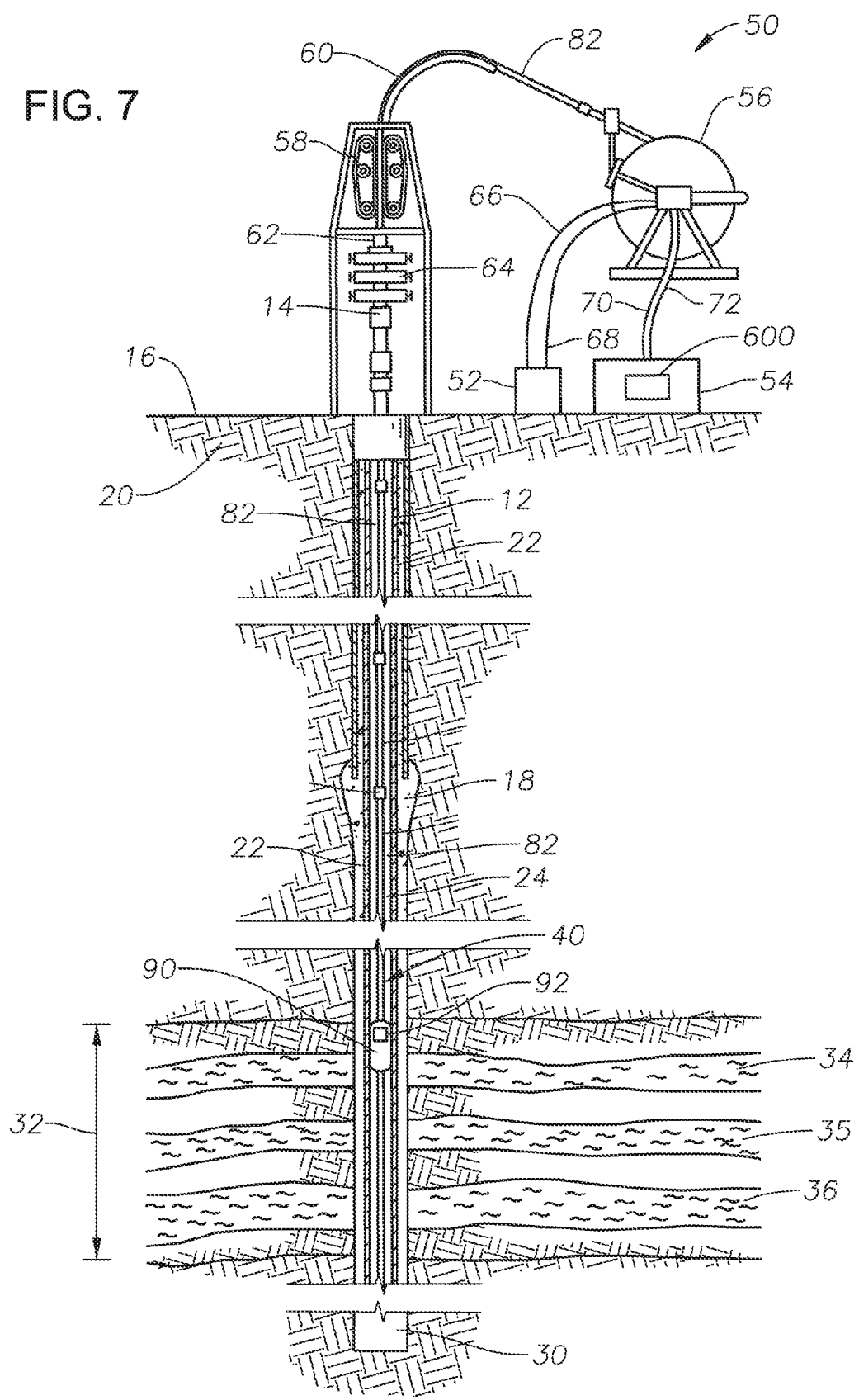
FIG. 7 is a schematic diagram showing a cross-sectional view of an illustrative wellbore stimulation treatment apparatus disposed within a subterranean formation.
Figure 8:
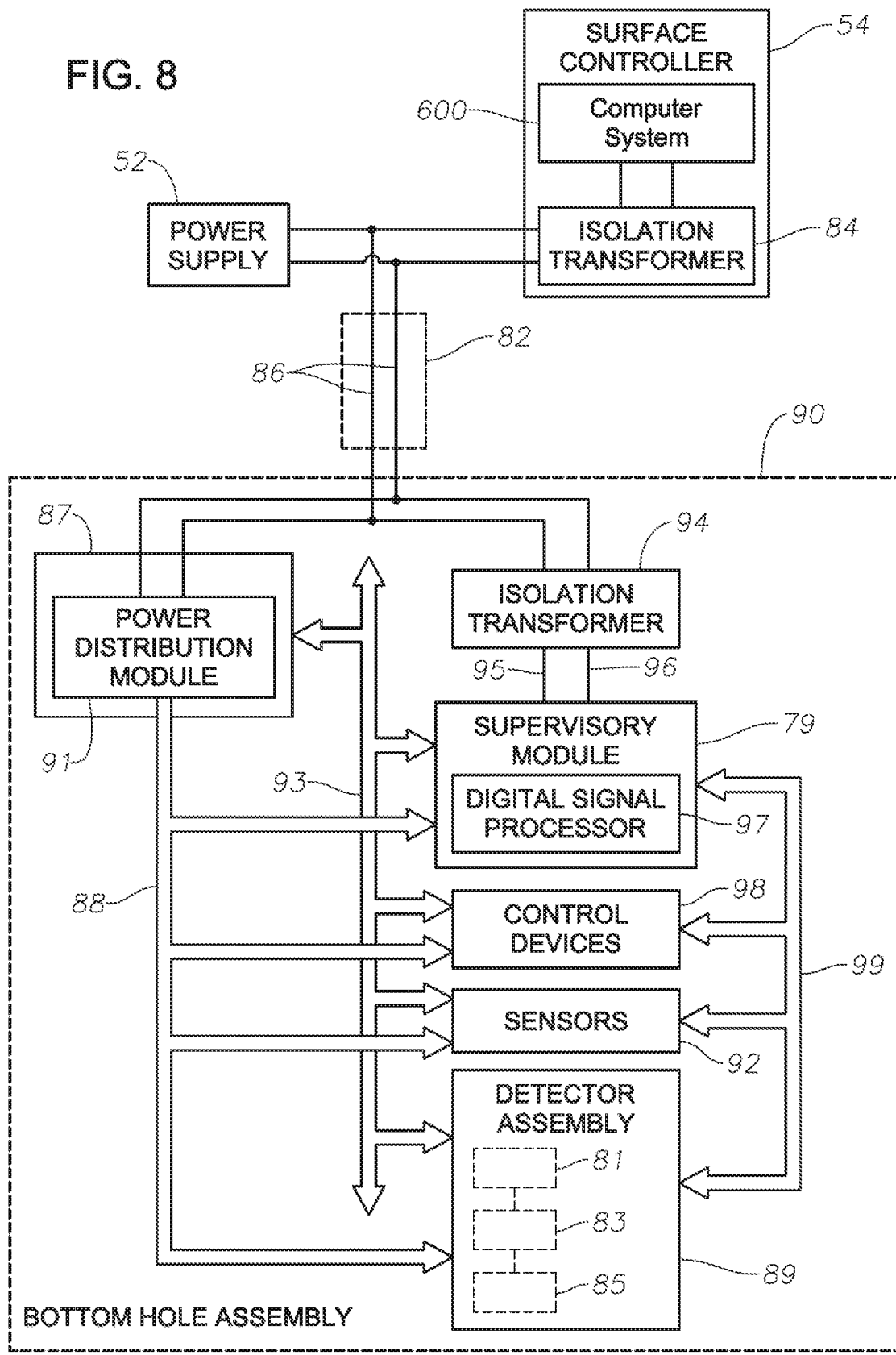
FIG. 8 is a functional block diagram of an illustrative electric power and control system for the wellbore stimulation treatment apparatus shown in FIG. 7.

As described above, embodiments of the present disclosure are particularly useful for stimulation treatment systems such as those illustrated in FIGS. 7 and 8.

FIG. 7 is a schematic diagram showing a cross-sectional view of an illustrative wellbore stimulation treatment apparatus disposed within a subterranean formation including a surface operating system 50, a work string of composite coiled tubing 82, and a bottom hole assembly (BHA) 90. Operating system 50 is positioned at the surface adjacent to well 12 and generally includes a well head 14 disposed atop of a well bore 18 that extends downwardly into an earthen formation 20. Borehole 18 extends from surface 16 to borehole bottom 30 and includes casing 22 extending there between. In the example shown, wellbore 18 includes at least one interval 32 containing three, spaced apart zones 34-36 that are believed to contain hydrocarbons that can be economically recovered. Hereinafter, such zones may sometimes be referred to as "producing zones" 34-36. It should be appreciated that this well environment is described for explanatory purposes, and that the present disclosure is not limited to the particular borehole thus described, it being appreciated that the present disclosure may be used in a variety of well bores. In particular, although the wellbore 18 is shown vertical, the wellbore may be a deviated wellbore and may further include a horizontal portion. BHA 90 is attached to the lower most end of coiled tubing 82, and may comprise downhole data acquisition devices 92 including DTS sensors described in more detail below. Coiled tubing 82 and BHA 90 make up a well treatment assembly 40 that is injected into and retrieved from borehole 18 by operating system 50.

Surface operating system 50 includes a power supply 52, a surface controller 54, a coiled tubing spool 56 and a tubing injector head unit 58. Injector head 58 feeds and directs coiled tubing 82 from the spool 56 into the well 12. Injector head 58 may receive a stimulation treatment fluid from a fluid source (not shown) and may direct the fluid through coiled tubing 82 into the well 12 for stimulation treatment of the wellbore 18. Although the coiled tubing 82 is preferably composite coiled tubing hereinafter described, it should be appreciated that the present disclosure is not limited to composite coiled tubing and in certain embodiments, may be steel coiled tubing with an electrical umbilical mounted on or within the steel coiled tubing. Certain embodiments may likewise be practiced using jointed metal pipe, rather than continuous metal or composite coiled tubing.

Tubing spool 56 feeds composite coiled tubing 82 over guide 60 and through injector head 58 and stripper 62. The composite coiled tubing 82 is injected through blowout preventer 64 and into well 12 by injector head 58, the tubing 82 forming an annulus 24 with the casing 22. The composite coiled tubing 82 preferably includes conductors 86 shown in FIG. 8 embedded in the wall of tubing 82. Electrical conductors 66, 68 electrically couple power supply 52 with the electrical conductors 86 in the wall of composite coiled tubing 82. Similarly, conductors 70, 72 couple controller 54 with the electrical conductors 86 in composite coiled tubing 82. It should be appreciated that, in this embodiment, both data and electrical power are transmitted through the electrical conductors 86. These conductors extend along the entire length of composite coiled tubing 82 and are coupled to various components in BHA 90, as hereinafter described.

Shown deployed in association with system 50 and configured within controller 54 is computer system 600 illustrated in FIG. 6 adapted for detection of the crossflow and quantification of crossflow effects on fluid distribution during stimulation treatments of hydrocarbon bearing reservoir formations as described in the present disclosure. For example, computer system 600 may be configured to perform the operations of workflow 200 illustrated in FIG. 2 and/or the operations of method 500 from FIG. 5, in order to detect crossflow at the wellbore 18, quantify crossflow effects on fluid distribution (e.g., distribution of stimulation treatment fluid) during a multistage fluid injection treatment applied at reservoir formation, and take appropriate actions at the wellsite to mitigate the quantified crossflow effects. As discussed, the multistage fluid injection may comprise a main injection stage having a high fluid injection rate, which is followed by at least one low rate injection stage having a substantially lower fluid injection rate. In one or more embodiments, temperature measurements along the length of the wellbore 18 taken during the main injection stage and the low rate injection stage (e.g., obtained by the BHA 90 and the DTS sensors 92 of FIG. 7) may be used by system 600 to perform the operations of workflow 200 from FIG. 2 and/or the operations of method 500 from FIG. 5 in order to quantify effects of crossflow on fluid distribution during the main injection stage of the multistage fluid injection treatment. Once the fluid distribution at the end of the main injection stage is known (accounting for the crossflow), computer system 600 may analyze treatment effectiveness. Depending on the analysis, computer system 600 may generate an appropriate order for system 50 to perform additional actions to mitigate the crossflow, such as injecting more amount of treatment fluid/diverter fluid, varying injection rate, and the like.

Referring now to FIG. 8, there is shown an illustrative schematic of the power and electronic control system for the BHA 90 of FIG. 7. The system includes a plurality of downhole sensors or data acquisition devices 92 (also illustrated in FIG. 7), a plurality of control devices 98, power distribution module 91, detector module 89 and supervisory module 88. As represented in FIG. 8, downhole data acquisition devices 92 include, for example, gamma tool sub, temperature sensors (e.g., DTS sensors), pressure sensors, load sensors and tilt sensors. It should be appreciated that sensors 92 and control devices 98 may not only include the particular sensors and control devices described above, but other data collection and measurement sensors and control devices well known in the art.

Surface power supply 52 provides power to power distribution module 91 in power sub 87 through conductors 86 which, as previously described, are embedded within coiled tubing 82 in this embodiment. Power distribution module 91 distributes power via a power bus 88 to supervisory module 79, detector sub 89, and the various other sensors 92 and control devices 98 in the bottom hole assembly 90.

A "slow" data bus 93 provides a command and data communication path between controller 97 in supervisory sub 79 and power distribution module 91, detector sub 89, and the various sensors 92 and control devices 98. Microcontrollers in each of the above components can communicate with each other via the slow bus 93. A "high speed" data bus may also be provided between the supervisory module 79, detector sub 89, and other data acquisition devices such as sensors 92. An example of a suitable high speed data bus may be a wireline data bus as is commonly used for wirelines.

The slow data bus 93 and high speed data bus 99 are coupled to supervisory module 79 which acts as a downhole controller for detector sub 89 and all downhole data acquisition devices 92 and control devices 98. Supervisory module 79 is coupled to a transformer 94 by data leads 95, 96. Leads 95, 96 are, in turn, coupled to conductors 86 embedded in coiled tubing 82 and extending to the surface. Conductors 86 are coupled to a second isolation transformer 84 in the surface operating system 50 at the surface. At the upper end of composite coiled tubing 82, transformer 84 couples these conductors to computer system 600 housed within surface controller 54. Transformers 94, 84 provide direct current isolation to protect uphole and downhole electronics from electrical faults.

The computer system 600 may comprise digital signal processor that is a programmable device which serves as a modem (modulator/demodulator) at the surface. Likewise, controller 97 in supervisory module 79 includes a digital signal processor and modem. Digital signal processor within computer system 600 and controller 97 each preferably includes analog-to-digital conversion circuitry to convert received signals into digital form for subsequent processing.

Each downhole sensor 92 and control device 98 and detector sub 89 has a modem with a unique address from data busses 93, 99. Thus, each modem may communicate individually and directly with the surface controller 54 using its unique address; however, it is preferred that each communicate with controller 97 in supervisory sub 79 and that, in turn, supervisory sub 79 communicate with surface controller 54. Surface controller 54 can initiate communications with a particular device's modem by sending a message to the unique address. The modem in the receiving device responds by communicating an acknowledgment to the surface. This allows the surface to communicate with each of the downhole control devices 98 and sensors 92. The downhole-surface communications preferably occur serially over conductors 86. The command signals down to the power distribution module 91 directs the power to the appropriately designated downhole device.

Generally no signal is sent downhole requesting that the data from the sensors 92 or detector 89 be forwarded to the surface. Instead, it is preferred that data collected by the downhole devices be constantly communicated to the surface in a coded stream which can be read or ignored as desired by computer system 600 in surface controller 54. The high speed data bus 99 is normally reserved for data communications. All of this data is in digital form.

The commands from the surface to the downhole control devices 98 are preferably time- or frequency-multiplexed and sent downhole via conductors 86. These communications may alternatively be sent downhole via conductors of other types that may be included in composite coiled tubing 82. In their simplest form, the command may simply be on and off signals. The electrical power on power conductors 86 is preferably provided in the form of direct current.

Although a certain amount of data processing may occur downhole in some of the devices 98, or in supervisory module 79, it is preferred that the bulk of the data processing occur at the surface. Some of the data is initially conditioned downhole in module 79 prior to being forwarded to the surface. Each downhole control device 98 includes a microprocessor which acts as a controller. These microprocessors are normally not used for the processing of data. Such downhole processing is unnecessary since more than adequate bandwidth is provided to send all data to the surface for processing.

All of the downhole control devices 98 are electrically powered from the surface. Although some downhole control devices 98 may have hydraulic components, such components are preferably electrically controlled.

The supervisory module 79 serves as the controller for the bottom hole assembly 90. The supervisory module 79 basically serves as a bus master and might be considered the hub of the downhole activity. It takes commands from the surface and retransmits them to the individual downhole devices. The supervisory module 79 also receives acknowledgements and data from the individual sensors 92 and detector sub 89 and retransmits them to the surface controller 54. The commands and data are preferably provided in a frame format that allows the supervisory module 79 to efficiently multiplex and route the frames to the desired destination. The supervisory module 79 preferably transmits information to the surface using quadrature amplitude modulation (QAM), although other modulation schemes are also contemplated.

The surface processor 54 provides a way to "close the loop" between the sensors 92, detector sub 89 and the downhole control devices 98. The surface controller 54 can direct the downhole control devices 98 to perform an action and received sensed data indicative of the results. If the results are not what was expected, or if the data acquisition devices 92 indicate the need for a different action, then the surface controller 54 can direct the control devices 98 to adjust their actions accordingly. This form of feedback enables precise control and a fast response to changing conditions.

Detector assembly 89 includes a sensor 81 which preferably is a "giant magnetoresistive" or GMR magnetic field sensor. The GMR sensor 81 is adapted to detect a change in a surrounding magnetic field and, in response thereto, generate a signal indicative of the change. The detector assembly 89 also includes a signal processor 83 that is operably interconnected with the sensor 81. The signal processor 83 receives the signal provided by the sensor 81, amplifies the signal, and shapes it in order to provide a processed signal more recognizable. At the surface, in the preferred embodiment described here, the processed signal features a readily recognizable square wave, the high state portion of which corresponds to the presence of a casing joint or perforation. The signal processor 83 includes an amplifier and an analog-to-digital converter (neither shown), which are well-known components. The amplifier enhances the signal while the converter is used to convert the analog readings obtained by the sensor 81 into a more readily recognizable digital signal. If desired, the signal processor 83 may incorporate one or more noise filters of a type known in the art in order to remove noise from the signal generated by the sensor 81. Other signal processing techniques used to enhance the quality of such signals may be applied. The detector assembly 89 further includes a data transmitter 85 that is operably interconnected with the signal processor 83. The data transmitter 85 receives the amplified and processed signal created by the signal processor 83 and transmits it supervisory module 79 to be processed and relayed to controller 54 located at the surface of the wellbore.

A method for detection of crossflow and quantification of crossflow effects on fluid distribution during stimulation treatments of hydrocarbon bearing reservoir formations has been described and may generally include: initializing a fluid distribution profile for at least one main stage of a multistage treatment of a reservoir formation; simulating the main stage of the multistage treatment to obtain a first set of simulated data for the main stage, based on the fluid distribution profile; comparing the first set of simulated data with a first set of measured data obtained for the actual main stage of the multistage treatment; adjusting the fluid distribution profile based on the comparison for the main stage, until the first set of simulated data matches the first set of measured data; simulating a secondary stage of the multistage treatment to obtain a second set of simulated data for the secondary stage, based on the adjusted fluid distribution profile, the secondary stage having a relatively lower fluid injection rate than that of the main stage; comparing the second set of simulated data with a second set of measured data obtained for the actual secondary stage of the multistage treatment; refining the adjusted fluid distribution profile based on the comparison for the secondary stage, until the first set of simulated data matches the first set of measured data and the second set of simulated data matches the second set of measured data; and estimating, based on the refined fluid distribution profile, the crossflow effects for one or more subsequent stages of the multistage treatment to be performed. Further, a computer-readable storage medium with instructions stored therein has been described, instructions when executed by a computer cause the computer to perform a plurality of functions, including functions to: initialize a fluid distribution profile for at least one main stage of a multistage treatment of a reservoir formation; simulate the main stage of the multistage treatment to obtain a first set of simulated data for the main stage, based on the fluid distribution profile; compare the first set of simulated data with a first set of measured data obtained for the actual main stage of the multistage treatment; adjust the fluid distribution profile based on the comparison for the main stage, until the first set of simulated data matches the first set of measured data; simulate a secondary stage of the multistage treatment to obtain a second set of simulated data for the secondary stage, based on the adjusted fluid distribution profile, the secondary stage having a relatively lower fluid injection rate than that of the main stage; compare the second set of simulated data with a second set of measured data obtained for the actual secondary stage of the multistage treatment; refine the adjusted fluid distribution profile based on the comparison for the secondary stage, until the first set of simulated data matches the first set of measured data and the second set of simulated data matches the second set of measured data; and estimate, based on the refined fluid distribution profile, the crossflow effects for one or more subsequent stages of the multistage treatment to be performed.

For the foregoing embodiments, the method or functions may include any one of the following operations, alone or in combination with each other: Adjusting the fluid distribution profile based on the comparison for the main stage comprises repeating the simulation, comparison, and adjustment of the fluid distribution profile for the main stage until the first set of simulated data matches the first set of measured data; Refining the adjusted fluid distribution profile based on the comparison for the secondary stage comprises repeating the simulation, comparison, and adjustment of the fluid distribution profile for the main stage until the first set of simulated data matches the first set of measured data, and repeating the simulation, comparison, and refinement of the adjusted fluid distribution profile for the secondary stage until the second set of simulated data matches the second set of measured data; Refining the adjusted fluid distribution profile further comprises matching the first set of simulated data with the first set of measured data and the second set of simulated data with the second set of measured data through squared error minimization optimization;

The first set of measured data comprises temperatures measured along a length of a wellbore within the reservoir formation after initiation of the main stage and before initiation of the secondary stage; The first set of simulated data comprises temperatures simulated along the length of the wellbore after the initiation of the main stage and before the initiation of the secondary stage; The second set of measured data comprises temperatures measured over time for a depth in the wellbore at which an increase in temperature is detected during the secondary stage; The second set of simulated data comprises temperatures simulated over time for the depth in the wellbore; The multistage treatment is selected from the group consisting of a matrix acidizing treatment, a water injection treatment, a scale squeeze treatment and a fracture stimulation; The multistage treatment is a matrix acidizing treatment, and the main stage of the multistage treatment is a primary fluid injection stage of the matrix acidizing treatment; The secondary stage of the multistage treatment is a low rate injection stage following the primary fluid injection stage of the matrix acidizing treatment; The secondary stage of the multistage treatment is a shut-in-stage following the primary fluid injection stage of the matrix acidizing treatment; The main stage and the secondary stage of the multistage treatment are simulated based on a forward model for simulating different stages of the multistage treatment of the reservoir formation; The forward model is a fluid placement simulator configured for simulating the crossflow at a wellbore of the reservoir formation and heat transfer associated with the reservoir formation; The secondary stage does not modify properties of the reservoir formation; The multistage treatment comprises multiple main stages each having a fluid injection rate relatively higher than a fluid injection rate of the secondary stage; Each of the main stages is associated with a measured data set and a simulated data set; The measured data set comprises temperatures measured along a length of a wellbore within the reservoir formation after initiation of that main stage and before initiation of a stage subsequent to that main stage; The simulated data set comprises temperatures simulated along the length of the wellbore after the initiation of that main stage and before the initiation of the subsequent stage.

Likewise, a system for quantifying crossflow effects on fluid distribution during stimulation treatments of hydrocarbon bearing reservoir formations has been described and includes at least one processor and a memory coupled to the processor having instructions stored therein, which when executed by the processor, cause the processor to perform functions, including functions to: initialize, based on data from the memory, a fluid distribution profile for at least one main stage of a multistage treatment of a reservoir formation; simulate the main stage of the multistage treatment to obtain a first set of simulated data for the main stage, based on the fluid distribution profile; compare the first set of simulated data with a first set of measured data obtained for the actual main stage of the multistage treatment; adjust the fluid distribution profile based on the comparison for the main stage, until the first set of simulated data matches the first set of measured data; simulate a secondary stage of the multistage treatment to obtain a second set of simulated data for the secondary stage, based on the adjusted fluid distribution profile, the secondary stage having a relatively lower fluid injection rate than that of the main stage; compare the second set of simulated data with a second set of measured data obtained for the actual secondary stage of the multistage treatment; refine the adjusted fluid distribution profile based on the comparison for the secondary stage, until the first set of simulated data matches the first set of measured data and the second set of simulated data matches the second set of measured data; and estimate, based on the refined fluid distribution profile, the crossflow effects for one or more subsequent stages of the multistage treatment to be performed.

For any of the foregoing embodiments, the system may include any one of the following elements, alone or in combination with each other: the functions performed by the processor to adjust the fluid distribution profile based on the comparison for the main stage include functions to repeat the simulation, comparison, and adjustment of the fluid distribution profile for the main stage until the first set of simulated data matches the first set of measured data; the functions performed by the processor to refine the adjusted fluid distribution profile based on the comparison for the secondary stage include functions to repeat the simulation, comparison, and adjustment of the fluid distribution profile for the main stage until the first set of simulated data matches the first set of measured data, and repeat the simulation, comparison, and refinement of the adjusted fluid distribution profile for the secondary stage until the second set of simulated data matches the second set of measured data; the adjusted fluid distribution profile is refined by matching the first set of simulated data with the first set of measured data and the second set of simulated data with the second set of measured data through squared error minimization optimization.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

While specific details about the above embodiments have been described, the above hardware and software descriptions are intended merely as example embodiments and are not intended to limit the structure or implementation of the disclosed embodiments. For instance, although many other internal components of computer system 600 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A method of quantifying crossflow effects on fluid distribution during stimulation treatments of hydrocarbon bearing reservoir formations, the method comprising:
    initializing a fluid distribution profile for at least one main stage of a multistage treatment of a reservoir formation;
    simulating the main stage of the multistage treatment to obtain a first set of simulated data for the main stage, based on the fluid distribution profile, wherein the first set of simulated data comprises temperatures simulated along a length of a wellbore after the initiation of the main stage and before an initiation of a secondary stage;
    comparing the first set of simulated data with a first set of measured data obtained for an actual main stage of the multistage treatment, wherein the first set of measured data comprises temperatures measured along the length of the wellbore within the reservoir formation after initiation of the main stage and before initiation of the secondary stage;
    adjusting the fluid distribution profile based on the comparison for the main stage, until the first set of simulated data matches the first set of measured data;
    simulating the secondary stage of the multistage treatment to obtain a second set of simulated data for the secondary stage, based on the adjusted fluid distribution profile, the secondary stage having a relatively lower fluid injection rate than that of the main stage, wherein the second set of simulated data comprises temperatures simulated over time for a depth in the wellbore;
    comparing the second set of simulated data with a second set of measured data obtained for an actual secondary stage of the multistage treatment, wherein the second set of measured data comprises temperatures measured over time for the depth in the wellbore at which an increase in temperature is detected during the secondary stage;
    refining the adjusted fluid distribution profile based on the comparison for the secondary stage, until the first set of simulated data matches the first set of measured data and the second set of simulated data matches the second set of measured data; and estimating, based on the refined fluid distribution profile, the crossflow effects for one or more subsequent stages of the multistage treatment to be performed.

2. The method of claim 1, wherein adjusting the fluid distribution profile based on the comparison for the main stage comprises:

repeating the simulation, comparison, and adjustment of the fluid distribution profile for the main stage until the first set of simulated data matches the first set of measured data.

3. The method of claim 1, wherein refining the adjusted fluid distribution profile based on the comparison for the secondary stage comprises:

repeating the simulation, comparison, and adjustment of the fluid distribution profile for the main stage until the first set of simulated data matches the first set of measured data; and repeating the simulation, comparison, and refinement of the adjusted fluid distribution profile for the secondary stage until the second set of simulated data matches the second set of measured data; or matching the first set of simulated data with the first set of measured data and the second set of simulated data with the second set of measured data through squared error minimization optimization.

4. The method of claim 1, wherein the multistage treatment:

is selected from the group consisting of a matrix acidizing treatment, a water injection treatment, a scale squeeze treatment and a fracture stimulation;

is a matrix acidizing treatment, and the main stage of the multistage treatment is a primary fluid injection stage of the matrix acidizing treatment; or comprises multiple main stages each having a fluid injection rate relatively higher than a fluid injection rate of the secondary stage.

5. The method of claim 4, wherein the secondary stage of the multistage treatment:

is a low rate injection stage following the primary fluid injection stage of the matrix acidizing treatment;

is a shut-in-stage following the primary fluid injection stage of the matrix acidizing treatment; or does not modify properties of the reservoir formation.

6. The method of claim 4, wherein:

each of the main stages is associated with a measured data set and a simulated data set;

the measured data set comprises temperatures measured along a length of a wellbore within the reservoir formation after initiation of that main stage and before initiation of a stage subsequent to that main stage; and the simulated data set comprises temperatures simulated along the length of the wellbore after the initiation of that main stage and before the initiation of the subsequent stage.

7. The method of claim 1, wherein the main stage and the secondary stage of the multistage treatment are simulated based on a forward model for simulating different stages of the multistage treatment of the reservoir formation.

8. The method of claim 7, wherein the forward model is a fluid placement simulator configured for simulating crossflow at a wellbore of the reservoir formation and heat transfer associated with the reservoir formation.

9. A system for quantifying crossflow effects on fluid distribution during stimulation treatments of hydrocarbon bearing reservoir formations, the system comprising:

at least one processor; and a memory coupled to the processor having instructions stored therein, which when executed by the processor, cause the processor to perform functions, including functions to:

initialize, based on data from the memory, a fluid distribution profile for at least one main stage of a multistage treatment of a reservoir formation;

simulate the main stage of the multistage treatment to obtain a first set of simulated data for the main stage, based on the fluid distribution profile, wherein the first set of simulated data comprises temperatures simulated along a length of a wellbore after an initiation of the main stage and before the initiation of a secondary stage;

compare the first set of simulated data with a first set of measured data obtained for an actual main stage of the multistage treatment, wherein the first set of measured data comprises temperatures measured along the length of the wellbore within the reservoir formation after initiation of the main stage and before initiation of the secondary stage;

adjust the fluid distribution profile based on the comparison for the main stage, until the first set of simulated data matches the first set of measured data;

simulate a secondary stage of the multistage treatment to obtain a second set of simulated data for the secondary stage, based on the adjusted fluid distribution profile, the secondary stage having a relatively lower fluid injection rate than that of the main stage, wherein the second set of simulated data comprises temperatures simulated over time for a depth in the wellbore;

compare the second set of simulated data with a second set of measured data obtained for an actual secondary stage of the multistage treatment, wherein the second set of measured data comprises temperatures measured over time for the depth in the wellbore at which an increase in temperature is detected during the secondary stage;

refine the adjusted fluid distribution profile based on the comparison for the secondary stage, until the first set of simulated data matches the first set of measured data and the second set of simulated data matches the second set of measured data; and estimate, based on the refined fluid distribution profile, the crossflow effects for one or more subsequent stages of the multistage treatment to be performed.

10. The system of claim 9, wherein the functions performed by the processor to adjust the fluid distribution profile based on the comparison for the main stage include functions to:

repeat the simulation, comparison, and adjustment of the fluid distribution profile for the main stage until the first set of simulated data matches the first set of measured data.

11. The system of claim 9, wherein the functions performed by the processor to refine the adjusted fluid distribution profile based on the comparison for the secondary stage include functions to:

repeat the simulation, comparison, and adjustment of the fluid distribution profile for the main stage until the first set of simulated data matches the first set of measured data; and repeat the simulation, comparison, and refinement of the adjusted fluid distribution profile for the secondary stage until the second set of simulated data matches the second set of measured data.

12. The system of claim 9, wherein the adjusted fluid distribution profile is refined by matching the first set of simulated data with the first set of measured data and the second set of simulated data with the second set of measured data through squared error minimization optimization.

13. The system of claim 9, wherein the multistage treatment:
    is selected from the group consisting of a matrix acidizing treatment, a water injection treatment, a scale squeeze treatment and a fracture stimulation;
    is a matrix acidizing treatment, and the main stage of the multistage treatment is a primary fluid injection stage of the matrix acidizing treatment; or
    comprises multiple main stages each having a fluid injection rate relatively higher than a fluid injection rate of the secondary stage.

14. The system of claim 13, wherein the secondary stage of the multistage treatment:
    is a low rate injection stage following the primary fluid injection stage of the matrix acidizing treatment; or
    is a shut-in stage following the primary fluid injection stage of the matrix acidizing treatment.

15. The system of claim 13, wherein:
    each of the main stages is associated with a measured data set and a simulated data set;
    the measured data set comprises temperatures measured along a length of a wellbore within the reservoir formation after initiation of that main stage and before initiation of a stage subsequent to that main stage; and
    the simulated data set comprises temperatures simulated along the length of the wellbore after the initiation of that main stage and before the initiation of the subsequent stage.

16. The system of claim 9, wherein the main stage and the secondary stage of the multistage treatment are simulated based on a forward model for simulating different stages of the multistage treatment of the reservoir formation.

17. The system of claim 16, wherein the forward model is a fluid placement simulator configured for simulating crossflow at a wellbore of the reservoir formation and heat transfer associated with the reservoir formation.

18. A computer-readable storage medium having instructions stored therein, which when executed by a computer cause the computer to perform a plurality of functions, including functions to:
    initialize a fluid distribution profile for at least one main stage of a multistage treatment of a reservoir formation;
    simulate the main stage of the multistage treatment to obtain a first set of simulated data for the main stage, based on the fluid distribution profile, wherein the first set of simulated data comprises temperatures simulated along a length of a wellbore after an initiation of the main stage and before the initiation of a secondary stage;
    compare the first set of simulated data with a first set of measured data obtained for an actual main stage of the multistage treatment, wherein the first set of measured data comprises temperatures measured along the length of the wellbore within the reservoir formation after initiation of the main stage and before initiation of the secondary stage;
    adjust the fluid distribution profile based on the comparison for the main stage, until the first set of simulated data matches the first set of measured data;
    simulate a secondary stage of the multistage treatment to obtain a second set of simulated data for the secondary stage, based on the adjusted fluid distribution profile, the secondary stage having a relatively lower fluid injection rate than that of the main stage, wherein the second set of simulated data comprises temperatures simulated over time for a depth in the wellbore;
    compare the second set of simulated data with a second set of measured data obtained for an actual secondary stage of the multistage treatment, wherein the second set of measured data comprises temperatures measured over time for the depth in the wellbore at which an increase in temperature is detected during the secondary stage;
    refine the adjusted fluid distribution profile based on the comparison for the secondary stage, until the first set of simulated data matches the first set of measured data and the second set of simulated data matches the second set of measured data; and
    estimate, based on the refined fluid distribution profile, crossflow effects for one or more subsequent stages of the multistage treatment to be performed.

19. The computer-readable storage medium of claim 18, wherein the functions performed by the computer further include functions to:
    repeat the simulation, comparison, and adjustment of the fluid distribution profile for the main stage until the first set of simulated data matches the first set of measured data; and
    repeat the simulation, comparison, and refinement of the adjusted fluid distribution profile for the secondary stage until the second set of simulated data matches the second set of measured data.

* * * * *